United States Patent [19]
Saihara et al.

[11] Patent Number: 5,926,725
[45] Date of Patent: Jul. 20, 1999

[54] METHOD OF MANUFACTURING SEMICONDUCTOR DEVICES WITH A REVERSE TAPERED SECTIONAL CONFIGURATION

[75] Inventors: Hidenori Saihara, Kawasaki; Hiroshi Naruse, Yokohama; Hiroyuki Sugaya; Shizue Hori, both of Tokyo, all of Japan

[73] Assignee: Kabushiki Kaisha Toshiba, Kawasaki, Japan

[21] Appl. No.: 08/853,882

[22] Filed: May 9, 1997

[30] Foreign Application Priority Data

May 13, 1996 [JP] Japan ................................ 8-142234

[51] Int. Cl.⁶ .................................................. H01L 21/306
[52] U.S. Cl. ........................ 438/481; 438/700; 438/701; 438/739; 438/503; 438/341
[58] Field of Search ..................................... 438/700, 701, 438/702, 706, 735, 737, 738, 739, 740, 503, 504, 311, 341, 360, 480, 481

[56] References Cited

U.S. PATENT DOCUMENTS

| | | |
|---|---|---|
| 4,579,621 | 4/1986 | Hine . |
| 4,675,074 | 6/1987 | Wada et al. . |
| 5,484,507 | 1/1996 | Ames . |

*Primary Examiner*—Charles Bowers
*Assistant Examiner*—Keith Christianson
*Attorney, Agent, or Firm*—Finnegan, Henderson, Farabow, Garrett & Dunner, L.L.P.

[57] ABSTRACT

In a method of manufacturing a semiconductor device, to form an opening in an insulation film such as a silicon oxide on a semiconductor substrate in a reverse tapered sectional configuration such that no gap is formed between a side surface of an epitaxial growth layer formed in the opening and the opening in the insulation film, the insulation film having the opening is subjected to a thermal process in an atmosphere of non-oxidizing gas including hydrogen elements such as hydrogen, silane or disilane gas. An opening is formed in the insulation film on the semiconductor substrate using isotropic etching. As a result of the above-described thermal process, decomposition of a silicon oxide proceeds from the interface between the insulation film and the semiconductor substrate at a side-wall of the opening to eventually form the opening in a reverse tapered sectional configuration at least in an edge portion thereof.

13 Claims, 7 Drawing Sheets

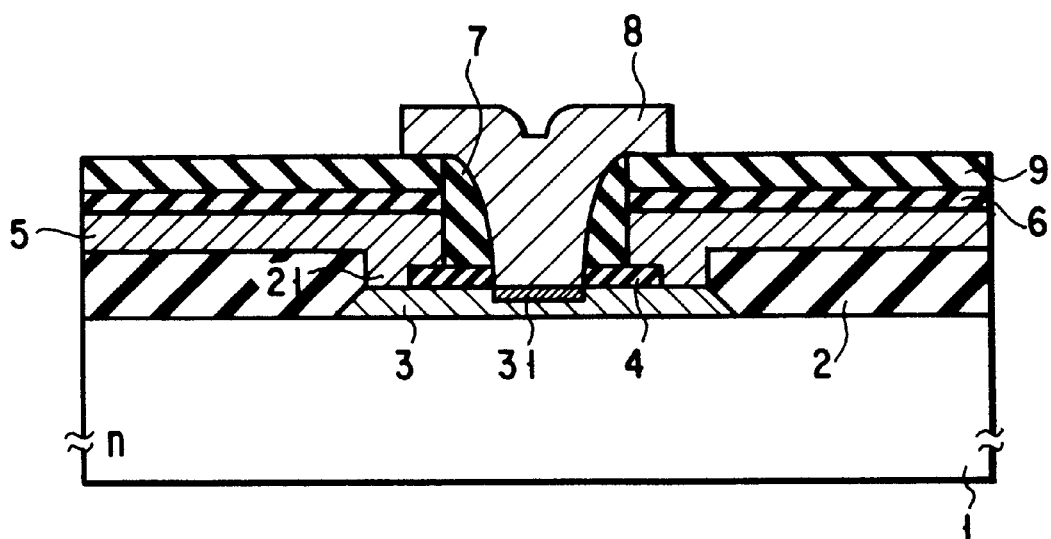
F I G. 1
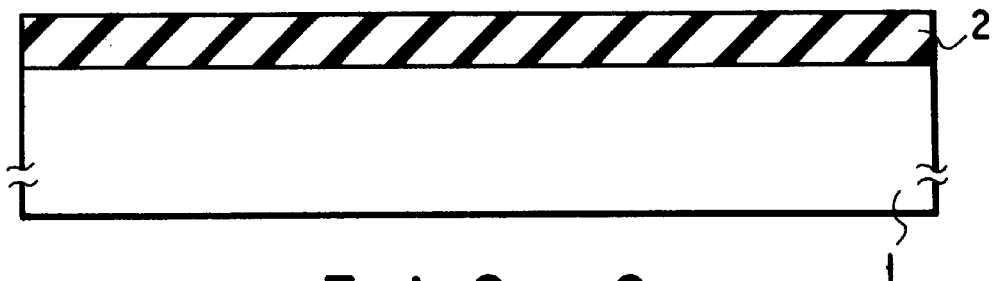
F I G. 2
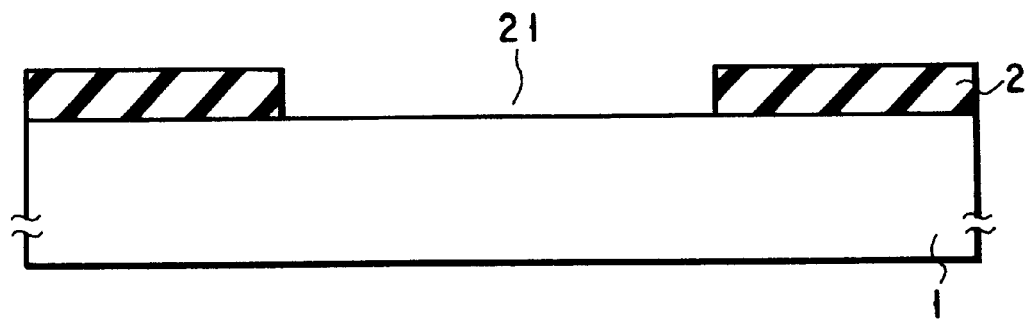
F I G. 3

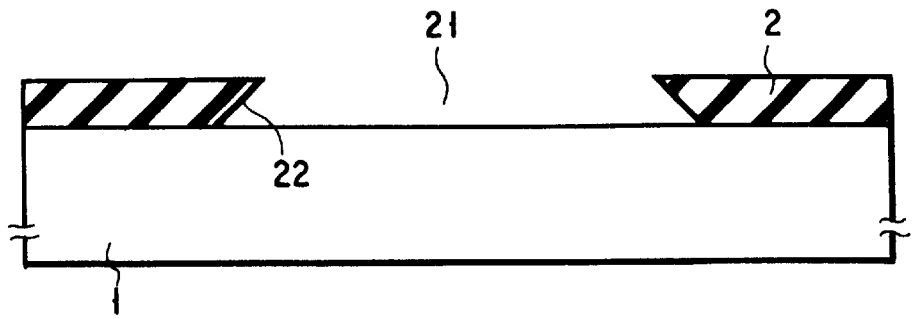
F I G. 4
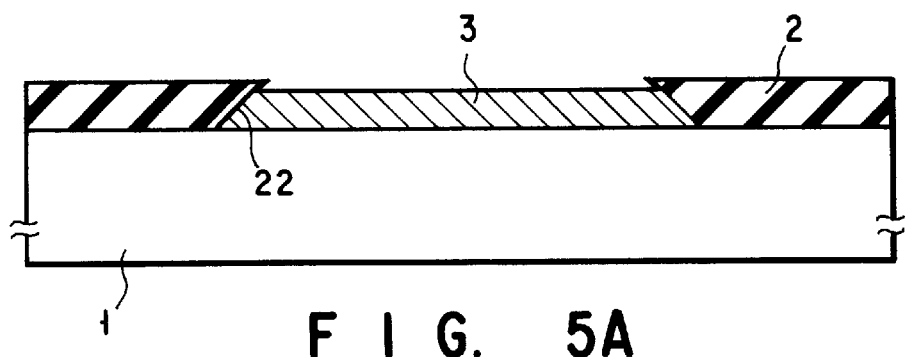
F I G. 5A
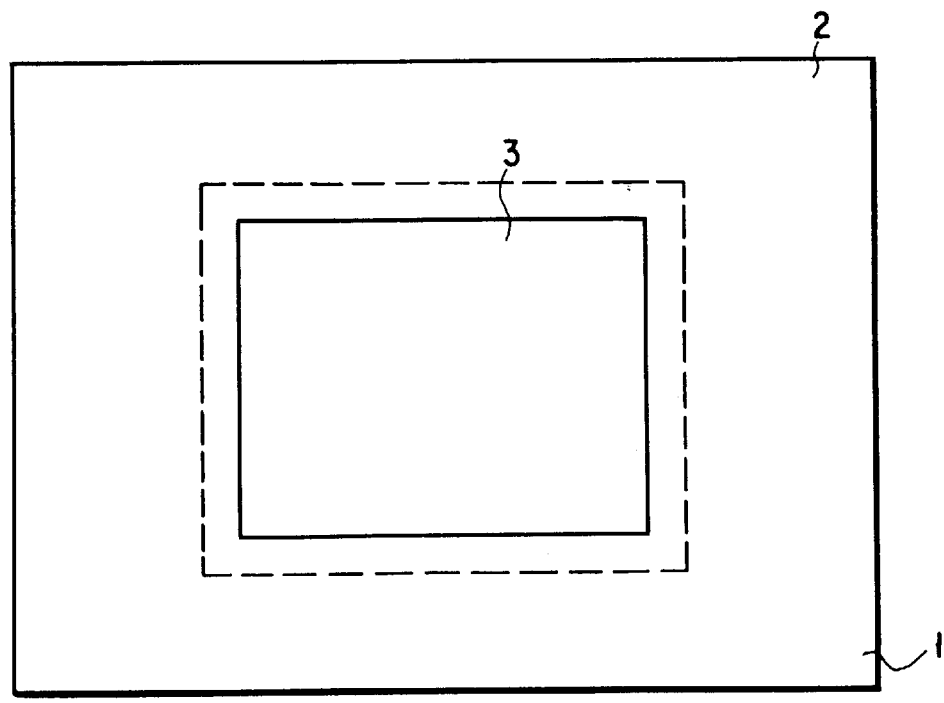
F I G. 5B

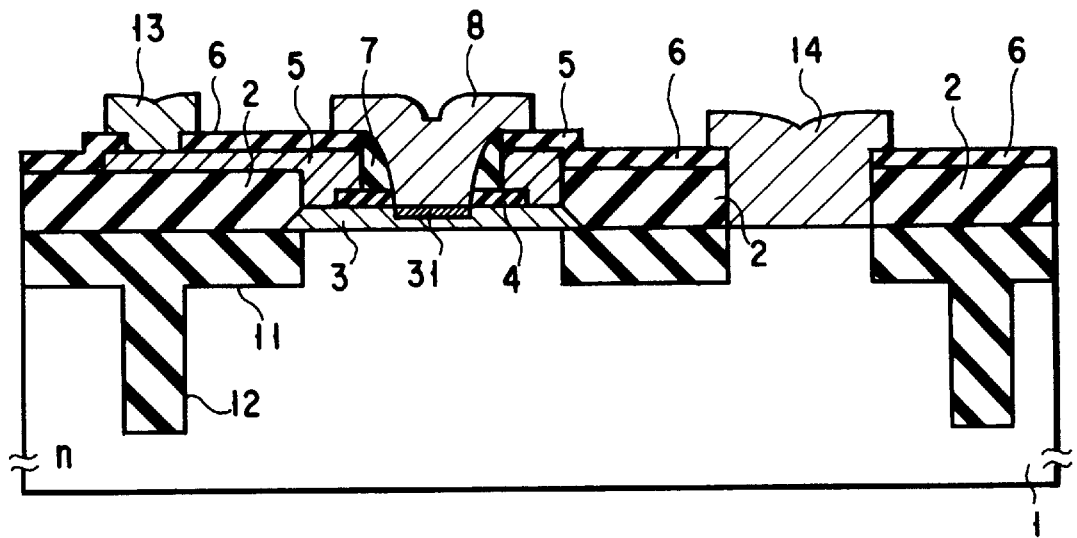
F I G. 9
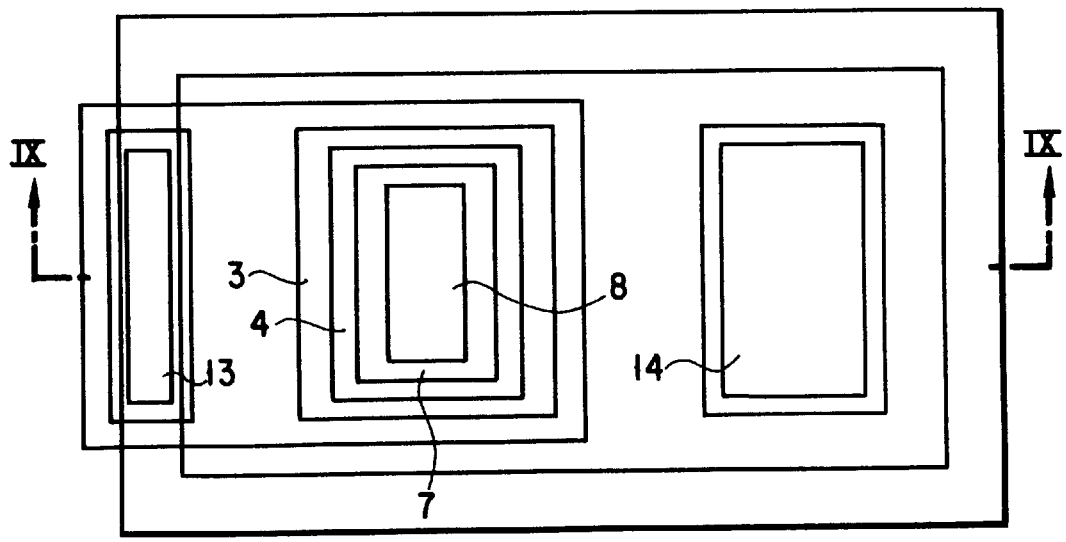
F I G. 10

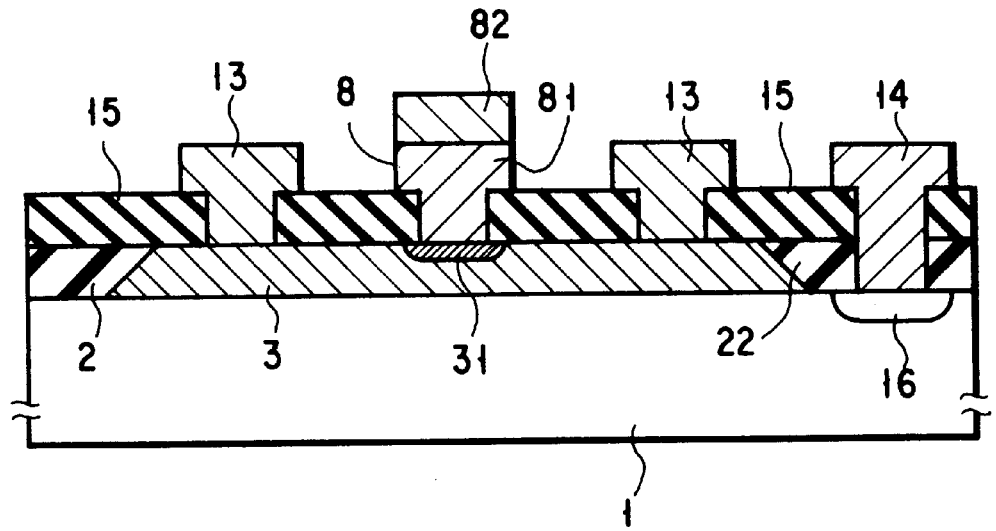
F I G. 11
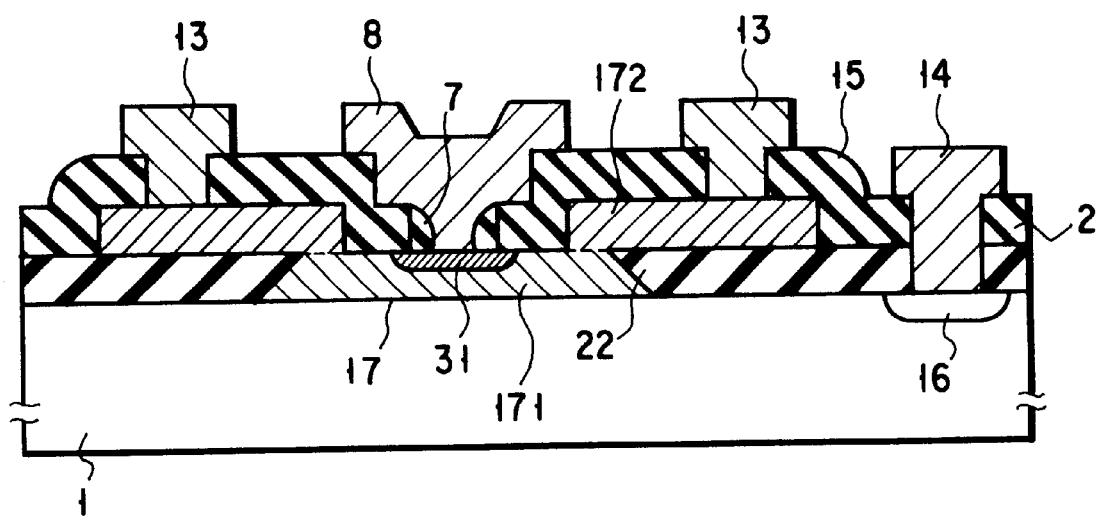
F I G. 12

METHOD OF MANUFACTURING SEMICONDUCTOR DEVICES WITH A REVERSE TAPERED SECTIONAL CONFIGURATION

BACKGROUND OF THE INVENTION

The present invention relates to a method of manufacturing a semiconductor device in which a semiconductor layer formed by means of selective epitaxial growth or non-selective epitaxial growth is provided on a semiconductor substrate and, more particularly, to a method of processing an opening in an insulation film on which an epitaxial growth semiconductor layer is formed.

Recently, devices have been proposed and are on the way of practical utilization in which higher speeds and higher level of integration can be achieved by forming shallow junctions, by means of low temperature epitaxial growth, in device active regions such as base regions of bipolar devices, source/drain regions and channel regions of CMOS devices. FIG. 13 is a sectional view of a semiconductor substrate on which a conventional bipolar transistor is formed, and FIG. 14 is a sectional view of a semiconductor substrate having a silicon layer selectively grown on the surface thereof which illustrates faults in a semiconductor layer. An insulation film 2 comprised of a $SiO_2$ film having a thickness of about 100 nm or the like is formed on an n-type silicon semiconductor substrate 1. Then, an opening 21 is provided in a region of the insulation film 2 where a base region is to be formed. As a seed for the insulation film, a material which can be easily grown on a selective epitaxial growth basis must be chosen and, for example, a $SiO_2$ film is appropriate for such a purpose. Pattern deviations can be suppressed during etching for forming the opening by employing anisotropic etching. The use of RIE (reactive ion etching) or the like results in damage in the semiconductor substrate. In this case, layers having damage must be removed by means of wet etching or the like. Next, a semiconductor layer 3 is formed in the opening 21 of the semiconductor substrate 1 by means of selective epitaxial growth that involves doping of boron (B).

The thickness of this film is about 70 to 100 nm, and the boron concentration is on the order of $5 \times 10^{18}$ to $7 \times 10^{18}$ atoms/cm$^3$. A growing temperature as low as about 700° C. allows a steep base profile to be formed. A selective grown layer can be grown using a gas of $SiH_2Cl_2$ or $SiH_4+HCl$ as a growing gas. It is preferable that edges of the selective epitaxial growth layer have a structure which does not produce facets. Next, a polycrystalline silicon semiconductor layer 5 heavily doped with p-type impurities and an insulation film (CVD $SiO_2$ film) 6 formed using CVD (chemical vapor deposition) are stacked, and the stacked element is patterned using anisotropic etching such that the selective epitaxial growth layer 3 and the polycrystalline silicon semiconductor layer 5 overlap each other. The p-type polycrystalline silicon semiconductor layer 5 patterned by such a process is used as an extraction electrode for a base and preferably has low resistance considering a need for reducing parasitic resistance. Next, a $SiO_2$ insulation film is grown using CVD and, thereafter, anisotropic etching is carried out on the entire surface to form a $SiO_2$ insulation film 7 on side-walls of the pattern of the stack of the p-type polycrystalline silicon semiconductor layer 5 and the insulation film 6. The side-wall insulation film 7 has a function of determining the dimensions of an emitter as well as separating a base electrode and an emitter electrode.

For example, when the width of the pattern openings 21 is 0.5 μm, the width of an emitter opening 21 can be reduced to about 0.2 μm by forming the side-wall insulation film 7 with a thickness of 0.15 μm. Next, an n-type polycrystalline silicon semiconductor layer 8 is formed in the openings 21, and a thermal process is performed under conditions at a level such that the temperature is 1000° C.; $N_2$ is used; and the duration is 20 sec. As a result, an n-type emitter diffusion region 31 is formed. The polycrystalline silicon semiconductor layer 8 is used as an emitter electrode (E). The p-type selective epitaxial growth layer 3 is used as a base region. The polycrystalline silicon semiconductor layer 5 is used as an external base electrode. The insulation films 2 and 6 are formed with openings to expose the underlying layer, and metal electrodes 13 and 14 are formed in contact with the underlying layer. The metal electrode 13 is used as a base extraction electrode (B), and the metal electrode 14 is used as an collector extraction electrode (C).

One of problems in the implementation of devices having active regions constituted by such a thin epitaxial layer is defects associated with leaks at junctions originating from microscopic faults produced at edges of an epitaxial growth pattern. For example, when a p-type semiconductor layer 3 is formed using selective epitaxial growth at an opening 21 of an insulation film 2 formed on an n-type semiconductor substrate 1 as shown in FIG. 14, microscopic faults (stacking faults) 32 are produced at edges of the pattern of the opening in the insulation film 2 due to the shape of the pattern edges of the opening in the insulation film 2 or due to a thermal stress or the like generated at the interface between the insulation film and the semiconductor layer. The faults 32 increase a junction leak current at leaking areas 33 at the interface between the epitaxial semiconductor layer and the semiconductor substrate, and this significantly reduces the production yield of integrated circuits. Further, selective epitaxial growth is normally accompanied by the occurrence of a facet in a semiconductor layer and, as a result, the side surface of the semiconductor layer is tapered (see FIG. 13). In this case, the problem of vulnerability to leaks at the junction between the epitaxial growth layer and the semiconductor substrate arises again because the thickness of the selective epitaxial growth layer is small at pattern edges thereof.

As a method of achieving tight contact between an insulation film and an epitaxial growth layer, a technique of forming a side-wall of an insulation film in a reverse tapered sectional configuration is known (see Jpn. Pat. Appln. KOKAI Publication No. 5-182981). According to this well-known technique, a side-wall of an insulation film is formed to have a sectional configuration which is in conformity with the configuration in which an epitaxial layer is grown. As a result, no facet is formed, and the epitaxial growth layer can be in tight contact with the side-wall of the insulation film. According to this technique, since an epitaxial growth layer is in tight contact with a side-wall of an insulation layer with no facet therebetween, it is possible to reduce leaks originating from poor jointing between an epitaxial growth layer and a semiconductor substrate due to the configuration of edge portions of the epitaxial growth layer. However, a problem still remains in that there is a need for an efficient method for forming an opening which can be efficiently used in combination with the method of forming an epitaxial growth layer.

The present invention has been conceived taking the above-described situation into consideration, and it is an object of the present invention to provide a method of manufacturing a semiconductor device comprising a novel means for processing an opening which forms an opening in an insulation film on a semiconductor substrate in a reverse tapered sectional configuration such that there is no gap between a side surface of an epitaxial growth layer formed in the opening and the opening in the insulation film.

BRIEF SUMMARY OF THE INVENTION

The present invention is characterized in that in order to form an opening in an insulation film on a semiconductor substrate in a reverse tapered sectional configuration such that no gap is formed between a side surface of an epitaxial growth layer formed in the opening and the opening in the insulation film, the insulation film having the opening is subjected to a thermal process in an atmosphere of non-oxidizing gas including hydrogen elements such as hydrogen, silane or disilane gas.

For a semiconductor device having a structure in which an epitaxial semiconductor layer is formed on an semiconductor substrate, an opening having a tapered sectional configuration is formed in an insulation film such as a silicon oxide on the semiconductor substrate using isotropic etching. As a result of the above-described thermal process, decomposition of a silicon oxide proceeds from the interface between the insulation film and the semiconductor substrate at a side-wall of the opening to eventually form the opening in a reverse tapered sectional configuration at least in an edge portion thereof.

Since an epitaxial growth layer comprised of single crystals of silicon is formed in an opening in an insulation film having such a configuration, no gap is formed between a side surface of the epitaxial growth layer and the insulation film opening which are therefore in tight contact with each other. This significantly reduces leaks originating from poor jointing between an epitaxial growth layer and a semiconductor substrate.

Further, epitaxial growth is started after performing a pretreatment on the surface of a semiconductor substrate using HF to remove a native oxide film and particles sticking thereto during the formation of an opening in an insulation film. Since hydrogen gas, silane, or the like not only forms such an opening but also has an effect of removing a native oxide film, such a pretreatment can be eliminated.

Specifically, according to a first aspect of the invention, there is provided a method of manufacturing a semiconductor device, characterized in that it comprises the steps of forming an opening in an insulation film formed on a semiconductor substrate of a first conductivity type to expose a main surface of the semiconductor substrate, performing a thermal process on the semiconductor substrate to shape the opening into a reverse tapered sectional configuration, and causing epitaxial growth of a semiconductor layer of a second conductivity type on the semiconductor substrate in the opening.

According to a second aspect of the invention, there is provided a method of manufacturing a semiconductor device, characterized in that it comprises the steps of forming an opening in an insulation film formed on a semiconductor substrate of a first conductivity type to expose a main surface of the semiconductor substrate, performing a thermal process on the semiconductor substrate to shape a side surface of the opening into a reverse tapered sectional configuration, and causing epitaxial growth of a semiconductor layer of a second conductivity type on the semiconductor substrate in the opening, and in that the semiconductor layer is formed from single crystals on the semiconductor substrate and polycrystals on the insulation film.

In the method of manufacturing a semiconductor device according to the first aspect of the invention, the semiconductor layer may be formed in a vapor phase growth system and the thermal process may be performed in this vapor phase growth system.

In the method of manufacturing a semiconductor device according to the first aspect of the invention, the thermal process may be performed in an atmosphere of a non-oxidizing gas including hydrogen elements. The non-oxidizing gas may be selected from among hydrogen gas, silane, and disilane.

In the method of manufacturing a semiconductor device according to the first aspect of the invention, the side surface of the opening having a reverse tapered section may be the same as the side surface of the semiconductor layer in configuration and those side surfaces may be in contact with each other.

In the method of manufacturing a semiconductor device according to the first aspect of the invention, the temperature of the thermal process may be in the range from 920° C. to 1200° C. and the duration of the thermal process may be in the range from 100 sec. to 600 sec.

According to a third aspect of the invention, there is provided a method of manufacturing a semiconductor device, characterized in that it comprises the steps of forming an opening in an insulation film formed on a semiconductor substrate of a first conductivity type to expose a main surface of the semiconductor substrate, performing a thermal process on the semiconductor substrate to shape the opening into a reverse tapered sectional configuration, causing epitaxial growth of a semiconductor layer of a second conductivity type on the semiconductor substrate in the opening, and forming an impurity diffusion region of the first conductivity type in a surface region of the semiconductor layer and in that a bipolar transistor is formed whose collector region, base region, and emitter region are constituted by the semiconductor substrate, semiconductor layer, and impurity diffusion region, respectively.

In the method of manufacturing a semiconductor device according to the second aspect of the invention, the semiconductor layer may be formed in a vapor phase growth system and the thermal process may be performed in this vapor phase growth system.

In the method of manufacturing a semiconductor device according to the second aspect of the invention, the thermal process may be performed in an atmosphere of a non-oxidizing gas including hydrogen elements. The non-oxidizing gas may be selected from among hydrogen gas, silane, and disilane.

In the method of manufacturing a semiconductor device according to the second aspect of the invention, the side surface of the opening having a reverse tapered section may be the same as the side surface of the semiconductor layer in configuration and those side surfaces may be in contact with each other.

In the method of manufacturing a semiconductor device according to the second aspect of the invention, the temperature of the thermal process may be in the range from 920° C. to 1200° C. and the duration of the thermal process may be in the range from 100 sec. to 600 sec.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a semiconductor device according to a first embodiment of the present invention;

FIG. 2 is a sectional view showing a step for manufacturing the semiconductor device of FIG. 1;

FIG. 3 is a sectional view showing a step for manufacturing the semiconductor device of FIG. 1;

FIG. 4 is a sectional view showing a step for manufacturing the semiconductor device of FIG. 1;

FIGS. 5A and 5B are a sectional view and a plan view, respectively, showing a step of manufacturing the semiconductor device of FIG. 1;

FIG. 9 is a sectional view of a semiconductor device according to a second embodiment of the present invention;

FIG. 10 is a plan view of the semiconductor device according to the second embodiment of the present invention;

FIG. 11 is a sectional view of a semiconductor device according to a third embodiment of the present invention;

FIG. 12 is a sectional view of a semiconductor device according to a fourth embodiment of the present invention;

DETAILED DESCRIPTION OF THE INVENTION

Figure 6A:
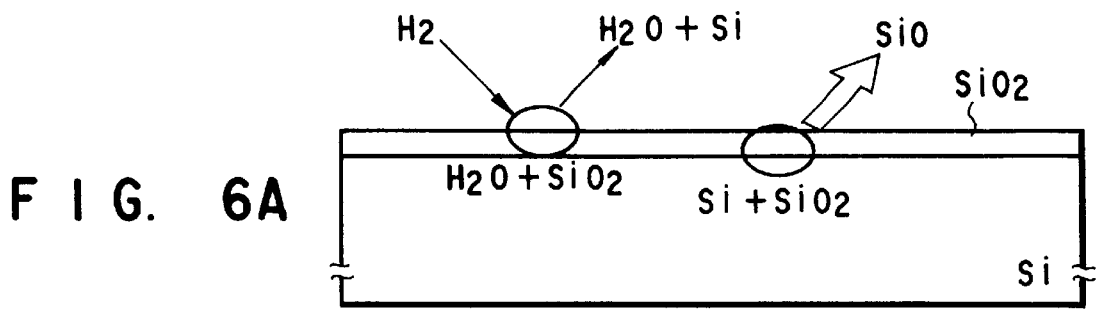
FIGS. 6A and 6B are sectional views of a semiconductor device illustrating a $H_2$ thermal process according to the present invention.

Preferred embodiments of the present invention will now be described with reference to the drawings.

A first embodiment of the present invention will now be first described with reference to FIGS. 1 through 4, FIG. 5A, and FIG. 5B. FIG. 1 is a sectional view of a semiconductor device. FIGS. 2 through 4 are sectional views illustrating steps for manufacturing the semiconductor device. FIGS. 5A and 5B are a sectional view and a plan view, respectively, of a semiconductor substrate having a semiconductor layer formed according to the steps shown in FIGS. 2 through 4. FIG. 1 shows a semiconductor device having a structure in which, for example, a p-type semiconductor layer is formed using low temperature selective epitaxial growth in an opening in an insulation film formed on an n-type silicon semiconductor substrate. An insulation film 2 comprising a silicon oxide film or the like is formed on an n-type silicon semiconductor substrate a having an impurity concentration on the order of $1 \times 10^{16}$ to $1 \times 10^{17}$ cm$^{-3}$. This insulation film 2 is formed with an opening 21 in which an epitaxial growth layer made of a silicon semiconductor or the like is formed. An edge portion of a side-wall of the opening 21 has a reverse tapered sectional configuration at least in the area in contact with the epitaxial growth layer. The opening 21 exposes a main surface of the semiconductor substrate 1 on which an epitaxial growth layer 3 made of a p-type silicon semiconductor is grown. The epitaxial growth layer 3 is not required to be grown to fill the entire space in the opening, and the growth may be stopped in the middle of the side-wall.

The reverse tapered configuration may extend to the entire area of the side-wall or may be limited to the area in contact with the epitaxial growth layer 3 as illustrated. That is, the area in a reverse tapered configuration can be determined depending on the thickness of the growth. A central region of the epitaxial growth layer 3 is covered by an insulation film 4 comprising a silicon oxide film or the like. A polycrystalline silicon film 5 which is to serve as wiring is formed on the insulation film 2, epitaxial growth layer 3, and insulation film 4 in electrical connection with the epitaxial growth layer 3. An insulation film 6 comprising a polycrystalline silicon film and an insulation film 9 comprising a silicon nitride film are stacked on the polycrystalline silicon film 5. An opening is formed through the insulation film 9, insulation film 6, polycrystalline silicon film 5, and insulation film 4 to expose a surface of the epitaxial growth layer 3 and a side-wall insulation film 7 comprising a silicon nitride film is formed on a side surface of the opening. The side-wall insulation film is formed on the insulation film 4 to cover side surfaces the insulation films 6 and 9 and the polycrystalline silicon film 5. An impurity diffusion region 31 is formed on the surface of the epitaxial growth layer 3 exposed at the opening. This is a region to serve as an emitter when a bipolar transistor is formed on the semiconductor substrate 1. A polycrystalline silicon film to serve as an emitter electrode is formed on the side-wall insulation film 7 in the opening and on the insulation film 9 around the opening in electrical connection with the impurity diffusion region 31.

Since the epitaxial growth layer is formed in the opening 21 in the insulation film 2 having such a reverse tapered sectional configuration, no gap is formed between the side surface of the epitaxial growth layer and the opening in the insulation film which will be therefore in a tight contact with each other. This significantly reduce leaks originating from poor jointing between the epitaxial growth layer and the semiconductor substrate.

Next, a method of manufacturing the above-described semiconductor device will be described with reference to FIGS. 2 through 5B.

First, an insulation film 2 comprising a silicon oxide film or the like is formed on a n-type semiconductor substrate (silicon wafer) 1 using CVD or the like (FIG. 2). A footrests (not shown) is applied on the insulation film 2 and patterned. Isotropic etching such as a wet etching process is performed using the patterned as a mask to form an opening 21 in the insulation film 2 (FIG. 3). The appropriate thickness of the insulation film is on the order of 200 nm, and a $SiO_2$ film or the like is preferable as a seed for the insulation film because there is a need for selecting a material which encourages the growth of the selective epitaxial growth layer. While the use of anisotropic etching allows deviations in pattern conversion to be suppressed, the use of RIE or the like can damage the semiconductor substrate and the damaged layers must be removed by means of wet etching or the like.

Next, the semiconductor substrate 1 is subjected to a thermal process in a vacuum chamber in which the epitaxial growth later will be formed at a subsequent step. The treatment is carried out in an atmosphere of hydrogen gas ($H_2$) at 1000° C. and 10 Torr for 300 sec. at a flow rate of 15000 cm$^3$/min. The semiconductor substrate 1 is subjected to the thermal process under such conditions and, as a result, the opening 21 in the insulation film 2 is formed into a reverse tapered sectional configuration (FIG. 4).

The thermal process utilizes a non-oxidizing gas including hydrogen elements, and appropriate gases other than hydrogen gas include silane ($SiH_4$), disilane ($Si_2H_6$), and trisilane ($Si_3H_8$). A non-oxidizing gas including hydrogen elements may be regarded unpreferable from an environmental point of view if it includes chlorine. The appropriate range of the temperature for the thermal process among the above-mentioned conditions is from 920° C. to 1200° C., and the appropriate range of the duration of the thermal process is from 100 sec. to 600 sec. The duration of the treatment can be shorter the higher the temperature for the treatment is.

Next, the epitaxial growth layer is formed in the same vacuum chamber. A monocrystalline p-type silicon semiconductor layer 3 is selectively grown on an epitaxial basis to a thickness of about 70 to 100 nm on the semiconductor substrate 1 encircled by the opening 21 in the insulation film 2. The growing temperature is as low as about 700° C., and the duration of the growth is about 10 minutes. The semiconductor substrate 1 is heated to the growing temperature in advance. This silicon semiconductor layer 3 is hereinafter referred to as "selective epitaxial growth layer".

The epitaxial growth layer 3 has a boron concentration on the order of $5 \times 10^{18}$ to $7 \times 10^{18}$ atoms/$cm^3$. The selective growth layer can be grown by using a gas of $SiH_2Cl_2$ or $SiH_4$+HCl. The partial pressure of the gas of $SiH_2Cl_2$ or $SiH_4$+HCl is about $1 \times 10^{-3}$ Torr (FIGS. 5A and 5B). Then, an insulation film 4 comprising, for example, a CVD $SiO_2$ film or the like is formed on the semiconductor substrate 1, patterned into a predetermined configuration, and positioned in a central region of the epitaxial growth layer 3. The insulation film 4 is not formed on a peripheral region of the epitaxial growth layer 3 and, therefore, a surface of the epitaxial growth layer 3 is exposed in that region. Next, the polycrystalline silicon semiconductor layer 4 heavily doped with p-type impurities, an insulation film (CVD $SiO_2$ film) 5 obtained using CVD, and a silicon nitride ($Si_3N_4$) insulation film 9 are stacked on the insulation films 2 and 4 and the exposed epitaxial growth layer 3, and the stacked element is patterned using anisotropic etching into a structure in which the epitaxial growth layer 3 and the polycrystalline silicon semiconductor layer 4 are in contact with each other. Next, an opening is formed in the stacked element by etching insulation films 6 and 9 and the polycrystalline silicon film 5 to expose the insulation film 4. Then, a $Si_3N_4$ insulation film is grown by means of CVD or the like and, thereafter, anisotropic etching is carried out on the entire surface to form a $Si_3N_4$ insulation film 7 on side-walls of the pattern of the stack of the p-type polycrystalline silicon film 5 and the insulation films 6 and 9 in the opening.

This side-wall insulation film 7 has a function of determining the dimensions of an emitter as well as separating a base electrode and an emitter electrode. Next, the insulation film 4 exposed on the bottom of the opening is removed, and an n-type polycrystalline silicon semiconductor layer 8 is formed on the insulation film 9 in and around the opening. Thereafter, a thermal process is performed under conditions on a level such that the temperature is 1000° C.; $N_2$ is used; and the duration is 20 sec. As a result, impurities are diffused from the n-type polycrystalline silicon semiconductor layer 8, thereby forming an n-type impurity diffusion region 31 which will become an emitter region on the surface of the selective epitaxial growth layer 3. Thus, a base region of a bipolar transistor is formed from the epitaxial growth layer 3. The p-type polycrystalline silicon semiconductor layer 5 is used as an extraction electrode for the base and preferably has low resistance because of a need for reducing parasitic resistance. The polycrystalline silicon semiconductor layer 8 is used as an emitter electrode. The polycrystalline silicon semiconductor layer 5 is used as an external base electrode. The p-type selective epitaxial growth layer 3 is used as a base region. The polycrystalline silicon semiconductor layer 5 is used as an external base electrode. In the opening of the insulation film 2, as a result of the above-described thermal process, decomposition of a silicon oxide proceeds from the interface between the insulation film and the semiconductor substrate at a side-wall of the opening to eventually form the opening in a reverse tapered sectional configuration at least in an edge portion thereof.

Thus, the present invention provides an efficient method of forming an opening which is in harmony with steps of fabricating an epitaxial growth layer. Since the epitaxial growth layer comprising silicon single crystals is grown in the opening in an insulation film having a reverse tapered sectional configuration, no gap is formed between a side surface of the epitaxial growth layer and the insulation film opening which will be therefore in tight contact with each other. This significantly reduces leaks originating from poor jointing between an epitaxial growth layer and a semiconductor substrate.

The method of forming a reverse tapered configuration at an opening will be described in more detail with reference to FIGS. 6A, 6B, 7A, 7B, 8A, 8B, and 8C. Those figures are all sectional views of a semiconductor substrate in the vicinity of an opening in an insulation film for illustrating how the thermal process step according to the present invention proceeds.

The thermal process step according to the present invention is performed for shaping an opening in an insulation film for growing an epitaxial growth layer. The thermal process is characterized in that, needless to say, a thin native oxide film on a semiconductor substrate is removed and in that a thick oxide film on the insulation film in the opening is decomposed and removed to change the configuration of the opening.

It has been common to clean a semiconductor substrate by removing oxide films and particles thereon. A semiconductor substrate after such a surface treatment has been subjected to formation of a native oxide film even after being placed in a vacuum chamber to form an epitaxial growth layer thereon, and such a native oxide film has been removed before the growth. According to the present invention, since a native oxide film is removed at the same time when an opening is formed, it is not necessary to perform a process of removing a native oxide film independently. Further, it is possible to eliminate the surface treatment before placing a semiconductor substrate in a vacuum chamber.

(a) Thermal process Using Hydrogen ($H_2$) Gas

Hydrogen gas is atomized and absorbed by the oxide film regardless of the thickness of the oxide film. The absorbed hydrogen atoms react with the oxide film to produce water vapor and silicon atoms. The water vapor is desorbed and the silicon atoms are absorbed by the oxide film. Those reactions are expressed by Equations 1 and 2 below.

$$H_2 \rightarrow 2H \qquad (1)$$

$$SiO_2 + 4H \rightarrow 2H_2O + Si \qquad (2)$$

During a treatment of a thin oxide film like a native oxide film, a reaction as expressed by Equation 3 shown below proceeds simultaneously with the reactions expressed by Equations 1 and 2.

Specifically, silicon in the semiconductor substrate reacts with the oxide film to produce silicon monoxide gas which is in turn desorbed from the semiconductor substrate. A reaction can conversely occur on the gas to produce an oxide film and silicon.

$$Si + SiO_2 \leftrightarrow 2SiO \tag{3}$$

(b) Thermal process Using Silane Gas

Similar reactions occur regardless of the thickness of the oxide film. Silane gas is decomposed into $SiH_2$ gas and hydrogen gas, and $SiH_2$ gas is absorbed by the surface of the semiconductor substrate. The $SiH_2$ absorbed by the surface of the substrate changes into silicon and silane gas. The silicon is absorbed by the substrate surface, and the silane gas is desorbed. Further, the absorbed silicon reacts with the oxide film to produce silicon monoxide gas which is in turn desorbed from the semiconductor substrate. Those reactions are expressed by Equations 4, 5, 6, and 7 below.

$$SiH_4 \leftrightarrow SiH_2 + H_2 \tag{4}$$

$$SiH_2(gas) \rightarrow SiH_2 \text{ (absorption)} \tag{5}$$

$$2SiH_2 \rightarrow Si + SiH_4 \tag{6}$$

$$Si + SiO_2 \rightarrow 2SiO \tag{7}$$

Figure 6B:
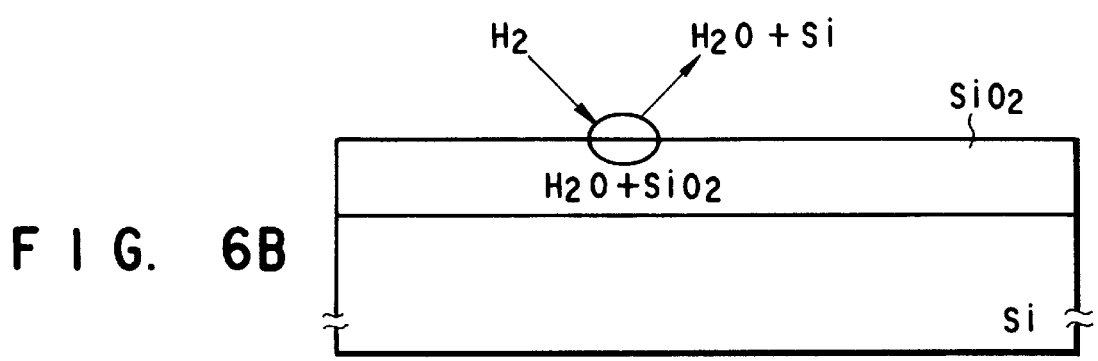

FIGS. 6A and 6B illustrate reactions caused by the thermal process in an atmosphere of hydrogen gas as described above.

FIG. 6A illustrates the state of a reaction on a semiconductor substrate having a native oxide film formed thereon. FIG. 6B illustrates the state of a reaction on a semiconductor substrate having thick oxide film formed thereon.

Figure 7A:
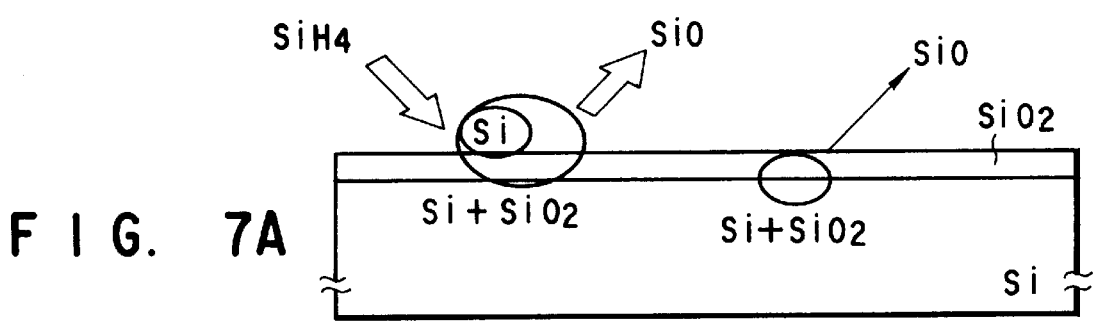
FIGS. 7A and 7B are sectional views of a semiconductor device illustrating a $SiH_4$ thermal process according to the present invention.
Figure 7B:
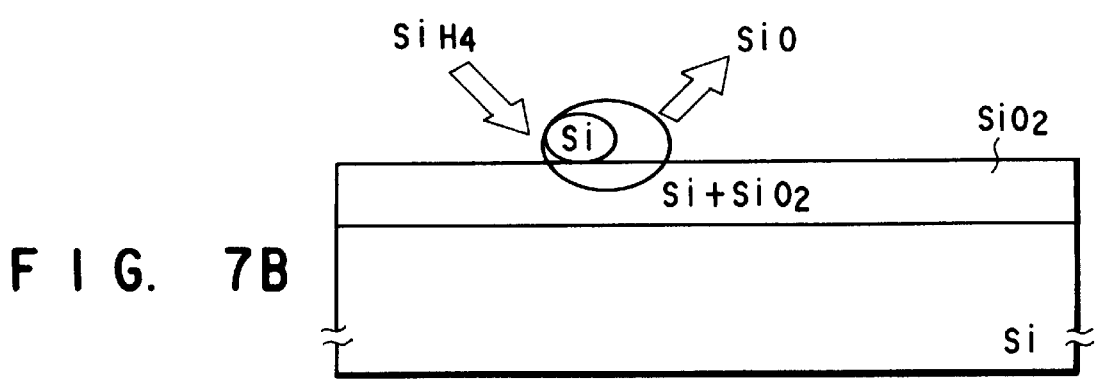

FIGS. 7A and 7B illustrate reactions caused by the thermal process in an atmosphere of silane gas as described above.

FIG. 7A illustrates the state of a reaction on a semiconductor substrate having a native oxide film formed thereon. FIG. 7B illustrates the state of a reaction on a semiconductor substrate having thick oxide film formed thereon.

Figure 8A:
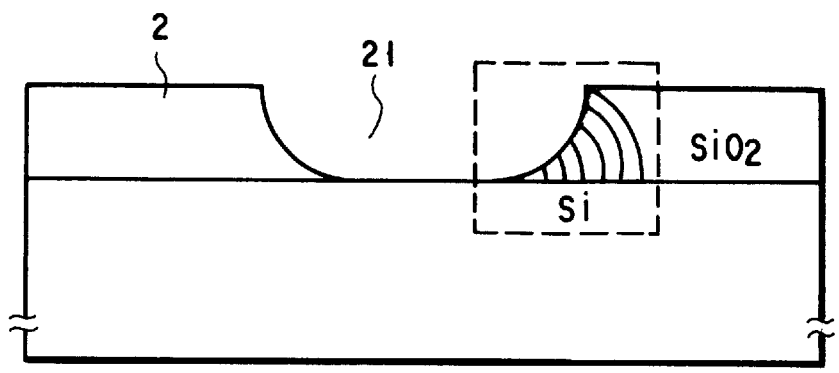
FIGS. 8A through 8C are sectional views of a semiconductor device illustrating a thermal process according to the present invention.
Figure 8B:
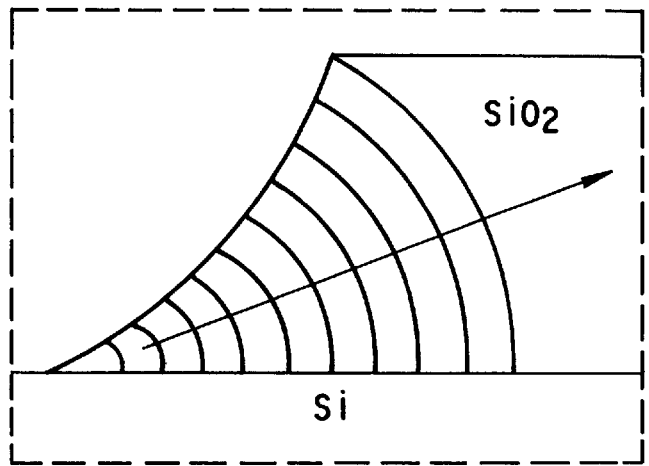
Figure 8C:
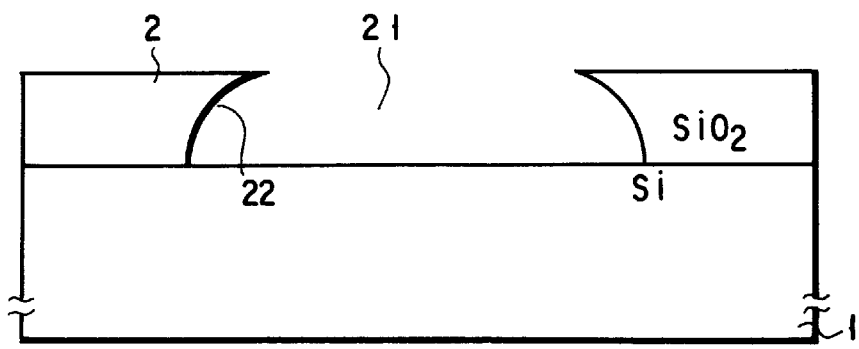
Figure 13:
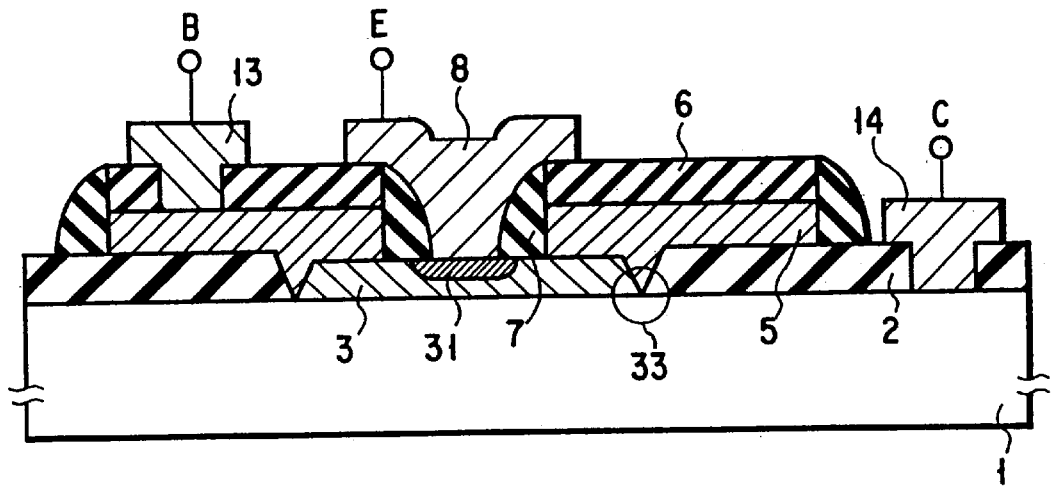
FIG. 13 is a sectional view of a conventional semiconductor device.
Figure 14:
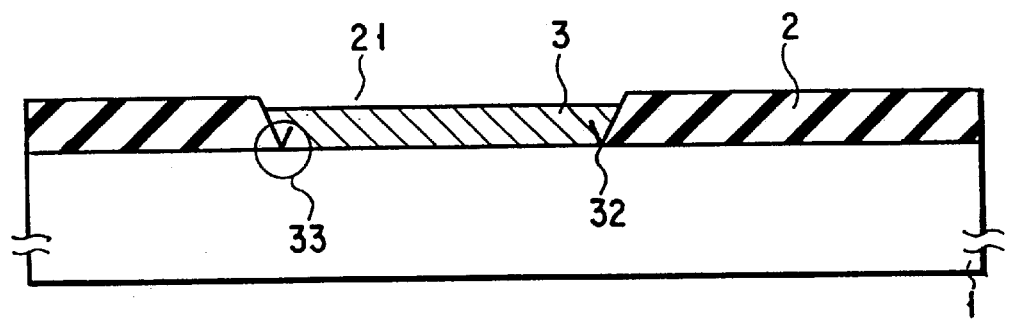
FIG. 14 is a sectional view of a conventional semiconductor device.

As described above, when the thermal process is performed on a silicon semiconductor substrate having a silicon oxide film on the surface thereof, the atmospheric gas undergoes reactions with the oxide film, the semiconductor substrate, and the like on the surface of the semiconductor substrate (FIG. 8A). Therefore, at an insulation film ($SiO_2$) having an opening 21 therein, decomposition of $SiO_2$ in the insulation film 2 starts at the bottom of the opening 21 and proceeds in the direction indicated by the arrow (FIG. 8B). When the thermal process is finished, the opening 21 has been formed to have a side-wall 22 in a reverse tapered configuration (FIG. 8C). When a treatment of a duration as short as about 30 to 60 sec. only removes a thin oxide film on the surface of the semiconductor substrate and does not provide the side-wall of the opening in a reverse tapered sectional configuration which meets the purpose.

A second embodiment of the present invention will now be described with reference to FIGS. 9 and 10.

FIG. 9 is a sectional view of a semiconductor device having including a bipolar transistor, and FIG. 10 is a plan view of the same. FIG. 9 is a sectional view taken along the line IX—IX in FIG. 10. The emitter-base region of the bipolar transistor is the same as that in the first embodiment. FIG. 9 shows a semiconductor device having a configuration in which, for example, a p-type semiconductor layer is formed using low temperature selective epitaxial growth in an opening in an insulation film formed on an n-type silicon semiconductor substrate. A device isolation region is buried in the n-type silicon semiconductor substrate 1 having an impurity concentration on the order of $1 \times 10^{16}$ to $1 \times 10^{17}$ $cm^{-3}$. The device isolation region is defined by a shallow trench 11 and a deep trench 12, and an insulation film comprising, for example, a $SiO_2$ film is buried in these trenches 11 and 12. An insulation film 2 comprising a silicon oxide film is formed on the semiconductor substrate 1. The insulation film 2 is formed with an opening in which an epitaxial growth layer 3 comprising a silicon semiconductor or the like is formed. An edge portion of a side-wall 22 of the opening has a reverse tapered sectional configuration at least in the area in contact with the epitaxial growth layer. The area of the side-wall of the opening which is not in contact with the epitaxial growth layer 3 is vertical. The opening exposes a main surface of the semiconductor substrate 1, and an epitaxial growth layer 3 comprising a p-type silicon semiconductor is formed on the main surface.

A central region of the epitaxial growth layer 3 is covered by an insulation film 4 comprising a silicon oxide film or the like. A p-type polycrystalline silicon film 5 which is to serve as a base electrode (a so-called external base region) is formed on the insulation films 2 and 4 and the epitaxial growth layer 3 in electrical connection with the epitaxial growth layer 3. An insulation film 6 comprising a silicon oxide film is formed on the polycrystalline silicon film 5. An opening is formed through the insulation film 6, polycrystalline silicon film 5, and insulation film 4 to expose a surface of the epitaxial growth layer 3 and a side-wall insulation film 7 comprising a silicon nitride film is formed on a side surface of the opening. The side-wall insulation film 7 is formed on the insulation film 4 to cover side surfaces the insulation film 6 and the polycrystalline silicon film 5. An impurity diffusion region 31 to constitute an emitter region is formed on the surface region of the epitaxial growth layer 3 exposed at the bottom of the opening. The epitaxial growth layer 3 constitutes a base region. A polycrystalline silicon film 8 to constitute an emitter electrode is formed on the side-wall insulation film 7 in the opening and on the insulation film 6 around the opening in electrical connection with the impurity diffusion region 31.

The side-wall insulation film 7 formed in the opening has a function of separating the emitter electrode and base electrode and a function of determining the dimensions of the emitter. An opening is formed in a predetermined region of the insulation film 6 on the polycrystalline silicon film 5, and a metal electrode 13 made of aluminum or the like to serve as a base extraction electrode is formed in the opening.

Further, an opening is formed in predetermined regions of the insulation films 2 and 6 on the semiconductor substrate 1 in a device region, and a metal electrode 14 made of aluminum or the like to serve as a collector extraction electrode is formed in the opening.

Since the selective epitaxial growth layer in the present embodiment grows in an opening having a reverse tapered sectional configuration in an insulation film, a side surface of this epitaxial growth layer and a side-wall of the insulation film opening form no gap therebetween and are therefore in tight contact with each other. This significantly reduce leaks originating from poor jointing between the epitaxial growth layer and the semiconductor substrate. The insulation film opening having a reverse tapered sectional configuration can be shaped to have a taper angle of 45° less by performing a thermal process thereon in an atmosphere of silane or hydrogen gas. Since this thermal process can be performed in an epitaxial growth system, efficiency of steps for manufacturing a semiconductor is improved.

A third embodiment of the present invention will now be described with reference to FIG. 11.

FIG. 11 is a sectional view of a bipolar transistor formed on a semiconductor substrate. Here, an example is shown in which a bipolar transistor is formed with a selective epitaxial growth layer 3 serving as a base region.

After forming the selective epitaxial growth layer 3 is formed along a side-wall 22 having a reverse tapered sectional configuration of an opening in an insulation film 2, an insulation film (CVD $SiO_2$ film) 15 is formed by means of CVD on the insulation film 2 and the epitaxial growth layer 3. An opening that exposes the underlying layer is formed by performing anisotropic etching or the like using a photoresist (not shown) patterned on this insulation film 15 as a mask. An n-type polycrystalline silicon semiconductor layer 81 is formed in the opening at which the epitaxial growth layer 3 is exposed and, thereafter, a thermal process is performed under conditions at a level such that the temperature is 1000° C.; $N_2$ is used; and the duration is 20 sec. As a result, impurities in the semiconductor layer 81 are diffused to form an n-type impurity diffusion region 31 which will become an emitter region.

The polycrystalline silicon semiconductor layer 81 is used as an emitter electrode 8 in combination with a metal electrode 82 made of aluminum formed on this semiconductor layer. The epitaxial growth layer 3 becomes a base region. A metal electrode 13 made of aluminum is formed in another opening in the insulation film 15 at which the epitaxial growth layer 3 is exposed in contact with this growth layer. The metal electrode 13 is used as a base extraction electrode. A metal electrode 14 made of aluminum is formed in an opening in the insulation film 15 at which the semiconductor substrate 1 is exposed in contact with a collector contact region 16 having a high impurity concentration on the semiconductor substrate 1. The metal electrodes 13 and 14 may be formed at the same step. The metal electrode 14 is used as a collector extraction electrode.

In the present embodiment, the epitaxial growth layer 3 also serves as an external base region.

Since the selective epitaxial growth layer in the present embodiment grows in an opening having a reverse tapered sectional configuration in an insulation film, a side surface of this epitaxial growth layer and a side-wall of the insulation film opening form no gap therebetween and are therefore in tight contact with each other. This significantly reduce leaks originating from poor jointing between the epitaxial growth layer and the semiconductor substrate. The insulation film opening having a reverse tapered sectional configuration can be shaped to have a taper angle of 45° less by performing a thermal process thereon in an atmosphere of silane or hydrogen gas. Since this thermal process can be performed in an epitaxial growth system, efficiency of steps for manufacturing a semiconductor is improved.

Next, a fourth embodiment of the present invention will be described with reference to FIG. 12.

While an epitaxial growth layer is selectively grown only on a surface of a semiconductor substrate exposed at an opening in an insulation film in the embodiments described so far, in the present embodiment, a semiconductor layer is grown on the entire surface of a semiconductor substrate including an insulation film and an opening therein. This semiconductor layer is normally referred to as "non-selective epitaxial growth layer".

First, an insulation film 2 of $SiO_2$ or the like having a thickness on the order of 100 nm is formed on an n-type silicon semiconductor substrate 1 having an impurity concentration on the order of $1 \times 10^{16}$ to $1 \times 10^{17}$ $cm^{-3}$.

Next, a photoresist (not shown) is applied to the insulation film 2 and is patterned. Etching such as RIE is performed to form an opening in the insulation film 2 using the patterned photoresist as a mask.

A p-type silicon semiconductor layer having a thickness on the order of 50 to 70 nm is formed, on a non-selective epitaxial growth basis, on the insulation film 2 and the semiconductor substrate 1 encircled by the opening. The growing temperature is as low as about 700° C. The non-selective epitaxial growth layer (hereinafter referred to as "epitaxial growth layer") grows not only on the semiconductor substrate 1 at the opening but also on the insulation film 2. In this case, single crystals are grown on the semiconductor substrate 1, and polycrystals are formed on the insulation film 2.

That is, this epitaxial growth layer 17 is constituted by a monocrystalline silicon region 171 grown in the opening and a polycrystalline silicon region 172 formed on the insulation film 2. Next, this silicon semiconductor layer 17 is patterned into a predetermined configuration. A side-wall of the opening has a reverse tapered sectional configuration. The epitaxial growth layer 17 in the opening is the monocrystalline silicon region 171.

Then, an insulation film (CVD $SiO_2$ film) 15 is stacked on the patterned silicon semiconductor layer 17 by means of CVD.

This insulation film 15 is patterned to form an emitter opening such that an emitter formation region is exposed, and the monocrystalline silicon region 171 is exposed at this opening. A side-wall insulation film 7 made of silicon nitride is formed on a side surface of this emitter opening. The polycrystalline silicon region 172 of the silicon semiconductor layer 17 is used as an extraction electrode for a base and preferably has low resistance because of a need for reducing parasitic resistance. Next, an n-type polycrystalline silicon semiconductor layer 8 is formed in the emitter opening and, thereafter, a thermal process is performed under conditions at a level such that the temperature is 1000° C.; $N_2$ is used; and the duration is 20 sec. As a result, an n-type impurity diffusion region 31 to become an emitter region is formed on a surface region of the polycrystalline silicon region 171.

The polycrystalline silicon semiconductor 8 is used as an emitter electrode. The monocrystalline silicon region 171 is used as a base region. The polycrystalline silicon region 172 is used as an external base electrode.

An opening is formed in each of the insulation films 2 and 15 to expose the underlying layer, and metal electrodes 13 and 14 are formed in contact with the underlying layer. The metal electrode 13 is used as a base extraction electrode, and the metal electrode 14 is connected to the collector contact region 16 having a high impurity concentration of the semiconductor substrate 1 to be used as a collector extraction electrode.

Since the non-selective epitaxial growth layer 3 in the present embodiment grows in an opening having a reverse tapered sectional configuration in the insulation film 2, a side surface of this epitaxial growth layer and a side-wall of the insulation film opening form no gap therebetween and are therefore in tight contact with each other. This significantly reduce leaks originating from poor jointing between the epitaxial growth layer and the semiconductor substrate. The insulation film opening having a reverse tapered sectional configuration can be shaped to have a taper angle of 45° less by performing a thermal process thereon in an atmosphere of silane or hydrogen gas. Since this thermal process can be performed in an epitaxial growth system, efficiency of steps for manufacturing a semiconductor is improved.

According to the present invention, an insulation film formed with an opening is subjected to a thermal process in an atmosphere of non-oxidizing gas including hydrogen elements such as hydrogen, silane or disilane gas. For a semiconductor device having a structure in which an epitaxial semiconductor layer is formed on an semiconductor substrate, an opening having a tapered sectional configuration is formed in an insulation film such as a silicon oxide on the semiconductor substrate using isotropic etching. As a result of the above-described thermal process, decomposition of a silicon oxide proceeds from the interface between the insulation film and the semiconductor substrate at a side-wall of the opening to eventually form the opening in a reverse tapered sectional configuration at least in an edge portion thereof. Since an epitaxial growth layer comprised of single crystals of silicon is formed in an opening in an insulation film having such a configuration, no gap is formed between a side surface of the epitaxial growth layer and the insulation film opening which are therefore in tight contact with each other. This significantly reduces leaks originating from poor jointing between an epitaxial growth layer and a semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising the steps of:

forming an opening in an insulation film formed on a semiconductor substrate of a first conductivity type to expose a main surface of said semiconductor substrate;

performing a thermal process on said semiconductor substrate to shape said opening into a reverse tapered sectional configuration; and causing epitaxial growth of a semiconductor layer of a second conductivity type on said semiconductor substrate in said opening.

2. A method of manufacturing a semiconductor device, comprising the steps of:

forming an opening in an insulation film formed on a semiconductor substrate of a first conductivity type to expose a main surface of said semiconductor substrate;

performing a thermal process on said semiconductor substrate to shape a side surface of said opening into a reverse tapered sectional configuration; and causing epitaxial growth of a semiconductor layer of a second conductivity type on said semiconductor substrate in said opening, wherein said semiconductor layer is formed from single crystals on said semiconductor substrate and polycrystals on said insulation film.

3. A method of manufacturing a semiconductor device according to claim 1, wherein said semiconductor layer is formed in a vapor phase growth system and wherein said thermal process is performed in said vapor phase growth system.

4. A method of manufacturing a semiconductor device according to claim 1, wherein said thermal process is performed in an atmosphere of a non-oxidizing gas including hydrogen elements.

5. A method of manufacturing a semiconductor device according to claim 4, wherein said non-oxidizing gas is selected from among hydrogen gas, silane, and disilane.

6. A method of manufacturing a semiconductor device according to claim 1, wherein said side surface of said opening having a reverse tapered section is the same as said side surface of said semiconductor layer in configuration and wherein said side surfaces are in contact with each other.

7. A method of manufacturing a semiconductor device according to claim 1, wherein the temperature of said thermal process is in the range from 920° C. to 1200° C. and wherein the duration of said thermal process is in the range from 100 sec. to 600 sec.

8. A method of manufacturing a semiconductor device, comprising the steps of:

forming an opening in an insulation film forged on a semiconductor substrate of a first conductivity type to expose a main surface of said semiconductor substrate;

performing a thermal process on said semiconductor substrate to shape said opening into a reverse tapered sectional configuration;

causing epitaxial growth of a semiconductor layer of a second conductivity type on said semiconductor substrate in said opening; and forming an impurity diffusion region of the first conductivity type in a surface region of said semiconductor layer, wherein a bipolar transistor is formed whose collector region, base region, and emitter region are constituted by said semiconductor substrate, semiconductor layer, and impurity diffusion region, respectively.

9. A method of manufacturing a semiconductor device according to claim 2, wherein said semiconductor layer is formed in a vapor phase growth system and wherein said thermal process is performed in said vapor phase growth system.

10. A method of manufacturing a semiconductor device according to claim 2, wherein said thermal process is performed in an atmosphere of a non-oxidizing gas including hydrogen elements.

11. A method of manufacturing a semiconductor device according to claim 10, wherein said non-oxidizing gas is selected from among hydrogen gas, silane, and disilane.

12. A method of manufacturing a semiconductor device according to claim 2, wherein said side surface of said opening having a reverse tapered section is the same as said side surface of said semiconductor layer in configuration and wherein said side surfaces are in contact with each other.

13. A method of manufacturing a semiconductor device according to claim 2, wherein the temperature of said thermal process is in the range from 920° C. to 1200° C. and wherein the duration of said thermal process is in the range from 100 sec. to 600 sec.

* * * * *

UNITED STATES PATENT AND TRADEMARK OFFICE
CERTIFICATE OF CORRECTION

PATENT NO. : 5,926,725
DATED : July 20, 1999
INVENTOR(S) : Hidenori SAIHARA et al.

It is certified that error appears in the above-identified patent and that said Letters Patent is hereby corrected as shown below:

Claim 8, Col. 14, Line 23, "forged" should read --formed--.

Signed and Sealed this

Eleventh Day of April, 2000

Attest:

Attesting Officer

Q. TODD DICKINSON

Director of Patents and Trademarks